United States Patent [19]

Fraden

[11] Patent Number: 5,054,936
[45] Date of Patent: * Oct. 8, 1991

[54] SENSOR FOR ACTIVE THERMAL DETECTION

[76] Inventor: Jacob Fraden, 72 Hampton Rd., Hamden, Conn. 06518

[ * ] Notice: The portion of the term of this patent subsequent to Aug. 8, 2006 has been disclaimed.

[21] Appl. No.: 437,093

[22] Filed: Nov. 16, 1989

[51] Int. Cl.$^5$ .......................... G01K 7/00; G01K 7/16
[52] U.S. Cl. .................................................. 374/164
[58] Field of Search ................... 374/164; 250/338.1, 250/341

[56] References Cited

U.S. PATENT DOCUMENTS

| | | | |
|---|---|---|---|
| 3,915,003 | 10/1975 | Adams | 374/164 |
| 4,061,917 | 12/1977 | Goranson et al. | 250/340 |
| 4,158,965 | 6/1979 | Prosky | 374/164 |
| 4,501,504 | 2/1985 | Urmenyi et al. | 374/164 |
| 4,544,441 | 10/1985 | Hartmann et al. | 250/338.1 |
| 4,574,263 | 3/1986 | Liddiard | 338/18 |
| 4,602,352 | 7/1986 | Coon et al. | 365/114 |
| 4,673,300 | 6/1987 | Wilhelmson et al. | 374/164 |
| 4,682,032 | 7/1987 | Barrett | 250/352 |
| 4,740,702 | 4/1988 | Huang et al. | 250/352 |
| 4,808,009 | 2/1989 | Sittler et al. | 374/164 |
| 4,854,730 | 8/1989 | Fraden | 374/164 |

Primary Examiner—William A. Cuchlinski, Jr.
Assistant Examiner—Diego F. F. Gutierrez
Attorney, Agent, or Firm—Robert A. Seemann

[57] ABSTRACT

A first heater is attached to a sensor capable of emitting thermal radiation toward an object to be sensed. Electrical energy provided to the heater, required to maintain the sensor at a predetermined temperature when it is radiating energy toward the object is monitored by a circuit which provides a signal that is indicative of the required energy. A second heater provides a baseline temperature for the sensor. For greater accuracy, two sensors are heated by a common baseline heater. One of the sensors is shielded from radiation toward the object and controls the baseline heater, the other sensor emits thermal radiation toward the object and has a heater for maintaining it at a predetermined temperature for providing the signal indicative of the required energy as described above.

9 Claims, 4 Drawing Sheets

SENSOR FOR ACTIVE THERMAL DETECTION

BACKGROUND OF THE INVENTION

1. Field of the Invention

This invention relates to a thermal infrared radiation detector, more specifically to an active detector, the sensing surface of which actively radiates energy toward an object.

2. Description of the Prior Art

Any material object radiates electromagnetic waves whose spectral characteristics depend on the object's temperature. That radiation can be detected either by quantum detectors or thermal radiation sensors.

Presently, a quantum detector is the component of choice in the design of an imaging sensor. A quantum detector requires cryogenic cooling to assure an acceptable signal-to-noise ratio. A variety of low temperature sensors have been proposed, such as those exemplified by the U.S. Pat. Nos. issued to Barrett (#4,682,032), Huang et al. (#4,740,702) and Coon et al. (#4,602,352).

For measuring thermal radiation at room temperature, thermal detectors are generally used. Thermal detectors operate on the principle of conversion of thermal radiation into heat and subsequent measurement of level of heat flow. Examples of these detectors are bolometers, thermopiles and pyroelectrics. The sensors which are covered by the present invention belong to the family of thermal detectors and generally are close to the bolometer type.

According to the Stefan-Boltzmann law, net power, Nr, transferred by radiation is governed by the following equation:

$$N_r = \epsilon_o \epsilon_s \sigma A (T_s^4 - T_o^4), \quad (1)$$

where $\epsilon_o$ and $\epsilon_s$ are emissivites of the object and the sensor respectively, $\sigma$ is a Stefan-Boltzmann constant, A is an optical coefficient, $T_o$ and $T_s$ are absolute temperatures of the object and the sensor respectively.

Thermal radiation can be detected either passively or actively. In the former case, a sensor (for instance, thermopile or bolometer) absorbs thermal (infrared) energy emanating from the object surface having temperature $T_o$ and converts that energy into an electrical signal.

The operating principle and design of active infrared sensors are covered for example by U.S. Pat. No. 4,854,730 issued to Fraden. The sensors radiate electromagnetic waves toward an object, rather than passively absorb them. The sensor's surface temperature is actively controlled at a predetermined level, Ts, by an external circuit. The electric power supplied for heating of the sensor surface must be equal to power loss. If conductive and convective losses can be reduced to a negligibly small level, then thermal radiation is the only loss which need be compensated for. The law of conservation of energy demands that $$N_r = V^2/R \quad (2)$$

where V is voltage across the heating element and R is its resistance. Since $T_s$ and R are maintained constant during the measurement, it follows from equations (1) and (2) that the object temperature can be unambiguously represented by voltage, V:

$$T_o = \sqrt[4]{T_s^4 - \frac{V^2}{R \epsilon_o \epsilon_s A}} \quad (3)$$

The above is a mathematical model of an active thermal sensor. One important advantage of an active sensor is its fast response. One problem associated with the active thermal sensor such as one described in patent No. 4,854,730 is a relatively high thermal loss in the sensor due to convection and conduction. This limitation makes it difficult to develop an imaging sensor using an active system. It presently requires an external temperature sensor for the correction of an error due to loss.

An active thermal radiation sensor can be fabricated by using thin film technology, like that used in the fabrication of bolometers - thermistor type infrared radiation sensors well known in the prior art. U.S. Pat. No. #4,574,263 issued to Liddard teaches a deposition on a substrate of a thin film detector (on the order of 10 nm) made of nickel, palladium, iridium or other materials. The detector element is connected to the bonding pads by thin film contacts. U.S. Pat. No. #4,061,917 issued to Goranson et al. teaches a deposition of a thin layer of bismuth over the heat sinking aluminum substrate with a thin electrical insulation layer sandwiched in between. The bismuth layer acts as a temperature sensitive resistor. Another U.S. Pat. No. 4,544,441 issued to Hartmann et al. describes a bolometric detector deposited on a film carrier for the improved speed response. The above cited patents are aimed at the development of an efficient sensor with an improved speed response, although speed remains a limiting factor for the wide use of bolometers in detecting and imaging devices.

SUMMARY OF THE INVENTION

It is an object of the present invention to develop an active infrared sensor with compensation for convective and conductive loss.

It is another object of the invention to provide a thermal radiation sensor which can operate in a broad ambient temperature range.

Also, it is another object of the invention to provide an active thermal radiation sensor with a separate heater which is independent of temperature sensing.

Further, it is an object of this invention to develop a thermal imaging sensor having fast speed response.

It is also an object of the invention to provide a control circuit for compensation of energy loss in an active thermal radiation sensor.

It is a further object of the present invention to provide a method for compensating for thermal loss in an active thermal radiation sensor.

The present invention provides better method for compensation for loss in the active infrared sensor and suggests a number of ways to construct such a sensors for measurement of thermal energy. The present invention assures conversion of most of the electric power supplied to the sensor into thermal radiation flux, thus improving sensor performance.

An active thermal radiation sensor generally comprises a temperature sensitive surface whose temperature is maintained constant during the measurement. Preferably, that temperature is selected to be higher than that of ambient and of the object. Generally, the surface temperature may be of any value as long as it can be maintained substantially constant during measurement. If radiation is the only way to lose energy, than, by measuring supplied electric power one could determine the radiation exchange with an object and to calculate the object's temperature quite accurately. Unfortunately, conductive and convective loss in the sensor may be significantly higher than that of thermal radiation. This makes calculation of the object's temperature difficult, especially under the condition where ambient temperature varies.

The present invention solves that problem by supplying additional heat energy to the active sensor, that is equal to all loss but that from the thermal radiation toward an object. The conductive and convective loss are functions of a sensor structure and ambient temperature. Compensating heating power is controlled by an electronic circuit and is conveyed to the sensor by additional heating elements.

The present invention provides heating elements which are in an intimate thermal contact with a temperature sensitive component. These elements may serve two purposes. The first purpose is to provide heat to the sensor's surface equal to that of conductive and convective loss. The second purpose is to provide heat equal to that lost to thermal radiation. As a result, more than one heating element can be built into the sensor.

The invention also provides for various arrangements in which heat losses from convection, conduction and radiation other than that to the object are compensated for. In one arrangement, a symmetrical sensor has at least one sensing element for making measurements necessary for compensation of heat loss. In another arrangement, the same sensor which measures temperature of an object also provides measurements for use in compensation of loss. In the present invention heat is provided to the sensor to compensate for the loss.

In another arrangement, multiple active infrared cells are placed on a common heating pad which provides a baseline heating function which enhances the cell speed response and reduces influence of ambient temperature. Such a multiple sensor can be used for thermal imaging at room temperature.

Generally, the active sensor is a multilayer device where each layer is created by sputtering deposition, lithographic or other techniques. All layers are preferably thin, ranging from 100 nm to 100 micrometers. There are several types of layers in the sensor: heating, electrical isolation and thermosensitive. Each layer has a specific function and is fabricated of specially selected materials.

A heating layer may be fabricated from any metal of relatively low resistance, such as gold, nickel, silver or aluminum. An electrical isolation layer can be made for example of silicon nitrate, polymer or glass. These layers must have a relatively high thermal conduction and a good electrical isolation properties. A thermosensitive layer can be made, for instance, of germanium, silicon, metal oxides and other materials which can form a resistor with relatively high TCR (temperature coefficient of resistance).

Alternatively, to measure surface temperature, a small discrete temperature sensor, such as RTD, chip thermistor or semiconductor, can be used instead of a temperature sensitive resistive layer. Also, a multi-layer sensor can be fabricated as a semiconductor wafer using micro-machining technology.

DETAILED DESCRIPTION OF THE INVENTION

The sensor's substrate, or carrier element of the sensor, must have generally low thermal mass and should have low thermal non-radiative coupling with the environment. Its surface includes a layer of material whose temperature is generally maintained at a predetermined level and which is controlled by an electronic circuit. The surface radiates infrared energy toward an object. The radiated power must be measured to calculate the object's temperature with equation (3). In accordance with the law of conservation of energy, measurement of radiated power can be done by measuring re-supplied electric power to bring the sensor up to predetermined temperature upon radiation of thermal energy from the sensor to the object.

Figure 1:
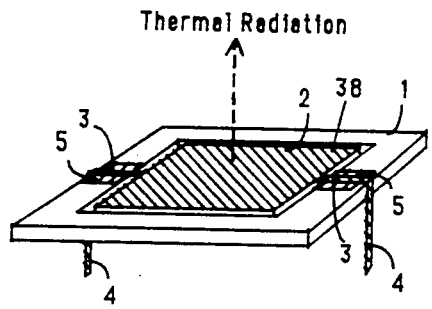
FIG. 1 is a schematic view of an active infrared sensor with two heating pads

FIG. 1 depicts a simple arrangement of an active sensor where sensing element 38 is suspended in a cavity of a sensor body 1. This lowers thermal coupling between these two components. The element can be supported either by thin joints (not shown) or by connecting contacts 3. The surface of the element 38 is covered by a temperature sensitive layer 2 which has a good infrared emitting capabilities. To improve the emission, layer 2 may be given an additional coating, like glass, polymer, lampblack or other high emission material. Two heating pads 5 are placed under contacts 3 to reduce thermal gradients across these contacts. Electrical connections to the pads are not shown.

The sensor of FIG. 1 operates as follows. The temperatures of layer 2 and of pads 5 are controlled by passing through each electric currents of such values as to maintain their temperatures close to each other. This reduces heat loss from the sensor's element 38 to the sensor's body 1. As a result, electrical heating energy supplied to layer 2 via wires 4 is spent for the radiation and convection loss only. To reduce convection loss, the sensor can be enclosed in vacuum. The temperature of pads 5 can also be further increased to provide additional compensation for convection as well as for conduction. Then, electric power supplied via wires 4 is fully converted into thermal radiation and the above equation (3) can be used to calculate the object's temperature.

Figure 2:
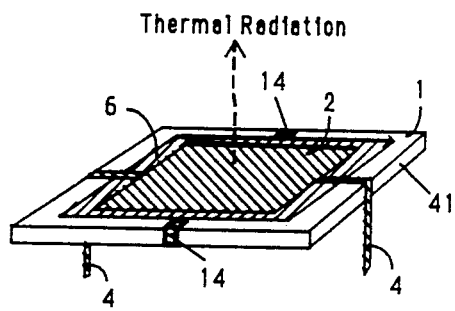
FIG. 2 is schematic view of an active sensor with heating under-layer

An alternative way to provide thermal compensation is shown in FIG. 2. Substrate 41 can be fabricated in a form of a membrane, film or thin carrier insulator made of ceramic, glass, polymer, etc. It also may be micromachined in a silicon wafer. A heating layer 6 is sandwiched between the substrate and the temperature sensitive layer 2. Naturally, temperature sensitive layer 2 can be replaced by another type of temperature sensitive component as was indicated above. Layer 6 is connected to the electronic circuit via contacts 14 while temperature sensitive layer 2 is connected to its associated circuit via wires 4. Electric current passing through contacts 14 warms up layer 6 and compensates for loss (other than radiation) from the upper layer 2. Temperatures of layers 2 and 6 must be close to each other. It is important to note, that the temperature sensitive layer 2 is heated via a separate circuit. If it is made of thermoresistive material, a self-heating effect can provide a sufficient rise in temperature. In that case, the layer has two functions: to measure its own temperature and to generate heat.

Figure 3:
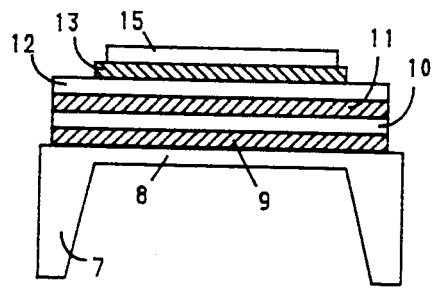
FIG. 3 is a cross-sectional view of a multi-layer sensor

Two functions: heat generation and temperature measurement can be separated in a more complex multi-layer sensor shown in FIG. 3. Here, a sensor structure 7 holds a substrate membrane 8 which, in turn, supports a first heating layer 9, a second heating layer 11, and temperature sensitive layer 13. Insulative layers 10 and 12 are sandwiched between the heating layers. A thin protective coating 15 with high emissive properties may be added on the top. Layer thicknesses are exaggerated for clarity. The first heating layer 9 compensates for conductive and convective loss, while the second heating layer 11 converts electric power into thermal radiation and its temperature is monitored by layer 13. Since the temperature of the first heating layer 9 is actively controlled, second heating layer 11 (whose function is to convert electric energy into thermal radiation) is normally isolated from membrane 8 and structure 7. In other words, the first heating layer 9 acts as a baseline temperature regulator. Additional heating of layer 9 can be used for the convective compensation. This compensation requires detection of both convective and conductive loss independently from that attributed to thermal radiation. Such detection will be covered below.

Figure 13:
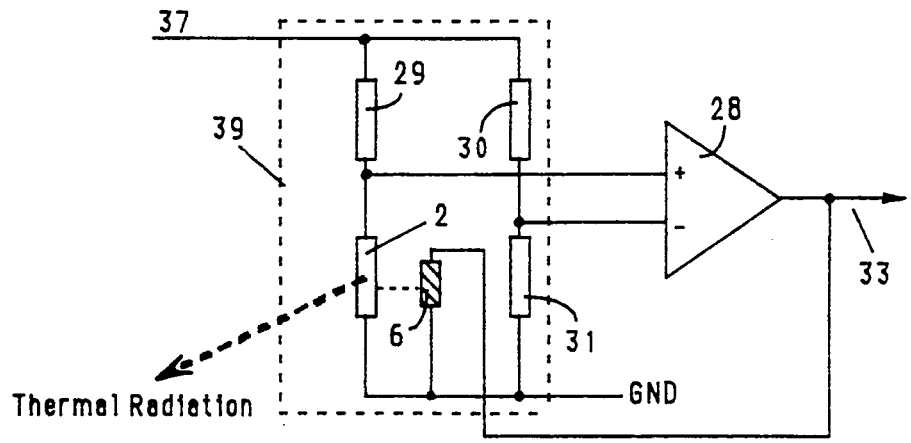
FIG. 13 is circuit diagram for the control of the active thermal sensor with additional heating layer.

The multi-layer arrangement allows for fabrication of an active sensor with better controlled characteristics. The sensor as depicted in FIG. 2, can be used in an alternative way, without conductive and convective loss compensation. In this case, the heating layer 6 provides thermal energy to the sensor's surface, while the temperature sensitive layer 2 is used for temperature measurement only. Self-heating effect in layer 2 is, therefore, of lesser importance and the loss power is determined by measuring voltage across heating layer 6. To illustrate operation of the sensor, the control circuit is shown in FIG. 13. The resistive bridge is comprised of resistors 29-32 and the layer 2. The bridge is powered from constant voltage 37. To maintain the bridge in balance, error amplifier 28 provides electric power to heating layer 6 which is thermally coupled to layer 2. When the bridge is balanced, output voltage 33 can be used for the temperature calculation.

Figure 4:
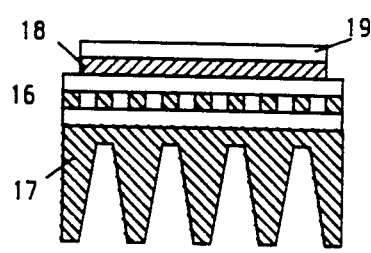
FIG. 4 is a cross sectional view of sensor with a thermoelectric element

Another way to provide a baseline heating function is with use of a thermo-electric element, for instance, one which functions with the Peltier effect. The arrangement of such a sensor is presented in FIG. 4, where thermoelectric element 16 is sandwiched between heat sink 17 and active infrared sensor 18 having top coating 19. Naturally, sensor 18 can be of a multi-layer nature, like that corresponding to the layers 11, 12 and 13 in FIG. 3. When the thermoelectric element is used, the sensor operating temperature can be selected either above or below ambient.

Figure 5:
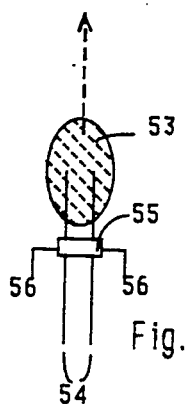
FIG. 5 is schematic view of a thermistor with a heater
Figure 7:
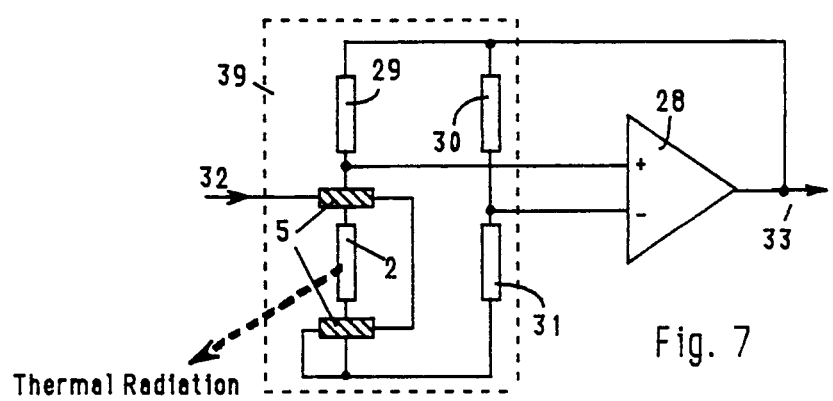
FIG. 7 shows a schematic with a self-balancing bridge
Figure 10:
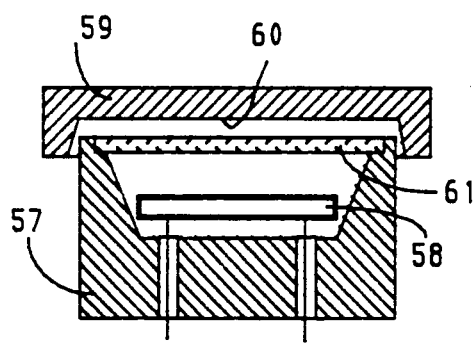
FIG. 10 is a schematic view of a thermal radiation probe

Since a simple discrete thermistor also can be used as a component in an active infrared sensor, its non-radiative loss can be compensated for in a similar manner. That compensation arrangement is depicted in FIG. 5, where a discrete thermistor 53 has two leads 54 sintered or otherwise attached to its body. A heater 55 is coupled to the thermistor near its leads. Electric current is supplied to the heater through contacts 56. Its value is controlled by an electronic circuit. All the above covered active infrared sensors require a detection of thermal loss which has to be compensated for prior to or after the infrared measurement is made. For purpose of illustration, a radiation temperature probe shown in FIG. 10 is comprised of a body 57 where the active infrared sensor 58 is housed. It may be protected from the environment by an infrared transparent window 61. Materials such as silicon, germanium, polyethylene and others can be used to fabricate the window. The window side of the body 57 is covered with cover 59. This cover may be designed in a shape of an external cup or a shutter which can be moved in and out of the field of view either manually or by an external mechanism. The inner surface 60 of the cover, 59 is given a coating, which in some application may be highly reflective (for instance, gold) or highly absorptive (for instance, goldblack). The sensor is used with circuits such as shown in FIGS. 7 or 13.

To calculate temperature of an object with the probe shown in FIG. 10, two measurements are required: with the cover closed and with it open. Once the baseline signal is established with the cover on, it is removed allowing the sensor to radiate energy toward the object and the second reading is taken. Electric heating energy required to maintain the sensor at a predetermined temperature, when it is radiating to the object, is related to the temperature of the object. FIG. 7 represents a self-balancing resistive bridge where an active thermal radiation sensor 39 is comprised of a self-heating temperature sensitive layer 2 which is a thermistor, and resistors, 29, 30 and 31 which are temperature independent. The bridge is connected to amplifier 28, and thanks to a self-heating effect in layer 2, is balanced. Non-radiative heat loss from the layer 2 is compensated for by heating pads 5 whose current is externally controlled by an analog or digital circuit 32 which is of a conventional design and is not described here. After the loss is compensated for and the bridge output voltage is close to zero or other known value, the sensor is exposed to a target and a new output voltage 33 will be required to rebalance the bridge. The voltage change is an indication of thermal radiation flux change and can be used for further signal processing. This circuit can be used for the interface with sensors illustrated in FIGS. 1, 2, 4 and 5.

Turning again to FIG. 10, lets see how all three parts (the sensor 58, the circuit of FIG. 7 and, for this illustration, reflective cover 59) operate during temperature measurement. Prior to measurement, cover 59 is positioned over window 61. An external data acquisition circuit (not shown here) reads voltage 33 and provides a sufficient current through the control input 32 to compensate for loss. It is important to note that when cover 59 is closed, its highly reflective inner surface 60 reflects most of the thermal radiation back to the sensor, resulting in a very low radiative loss. A total compensation is achieved when voltage 33 becomes close to zero. From that moment, sensor 58 is ready to read infrared radiation from an object and cover 59 can be opened. Upon opening of the cover, thermal flux is radiated toward the object and voltage at the positive input of amplifier 28 can be used in equation (3) for temperature calculation. If the inner surface 60 can be made highly emissive, an additional reference temperature sensor (not shown) must be provided to monitor temperature of cover 59. A signal from that sensor can be used in a processing system to compensate for the change in ambient temperatures.

Figure 6:
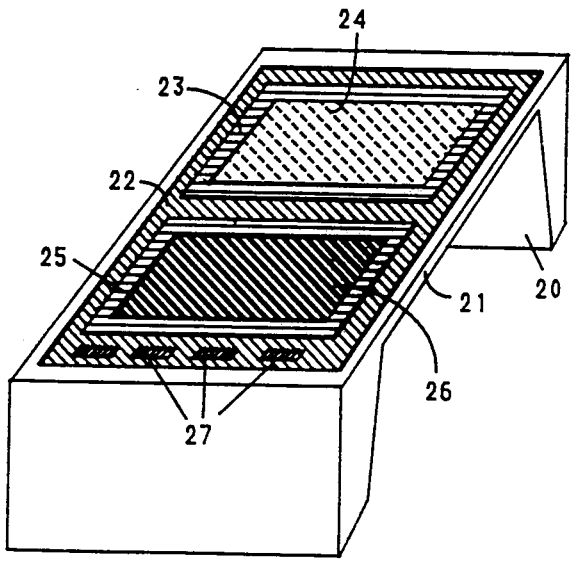
FIG. 6 is a schematic perspective view of a dual active sensor

Alternatively, it is possible to compensate for loss simultaneously with the infrared radiation measurement. This requires an allocation of at least one part of the sensor for the infrared energy emission and at least one part of the sensor for the loss compensation. An arrangement of FIG. 6 illustrates this design, although a more complex sensor with multiple detecting and compensating sections can be constructed without departing from the spirit of this invention. The dual sensor of FIG. 6 is divided into two symmetrical sections, which are formed on the top of thin substrate 21 supported by sensor body 20. For clarity, isolation layers, connecting pads and electrical contacts are not shown.

One portion of the sensor has first temperature sensitive layer 26 of high emissivity. This can be done, for instance, by giving the surface goldblack coating. Another portion of the sensor which contains second temperature sensitive layer 24 either may be treated to have low emissivity in the far infrared range or it can be shielded from radiating heat to the environment by an external shield.

Both sections share common heating layer 22 and have similar layers: first heating pad 23 and second heating pad 25. The arrangement is such, as to provide maximum thermal coupling within each portion: between layers 22, 23 and 24, and separately between layers 22, 25 and 26. On the other hand, it is important to minimize thermal coupling between both portions of the sensor.

Additional resistors 27 can be deposited on heating layer 22 for better thermal stability. These resistors are part of the control circuit which is described below. The first heating pad 23 is not electrically connected and its purpose is solely to provide better thermal symmetry between both portions of the sensor.

The sensor of FIG. 6 operates as follows. Since both sections deposited on the same heating layer 22, are fabricated simultaneously and have identical arrangements, it is reasonable to expect that they will suffer from the same conductive and convective thermal loss under any reasonable ambient conditions. The only difference between the two portions is in the ability of upper layers 24 and 26 to emit thermal radiation toward an object. As a result, thermal radiation loss will be different for both portions. For instance, if layer 26 has a coefficient of emissivity $\epsilon_{s1} = 0.98$ and the layer 24 is gold plated and has $\epsilon_{s2} = 0.02$, the layer 26 will emanate from it surface about 50 times stronger infrared flux and can be used for measuring temperature of a target, while the portion containing a low emissivity layer 24 is used for the loss compensation.

Alternatively, several non-symmetrical sensors can be combined in a single package in such a manner, where at least one of them is shielded from the environment and is used to monitor other than radiative loss for purpose of its compensation.

Figure 9:
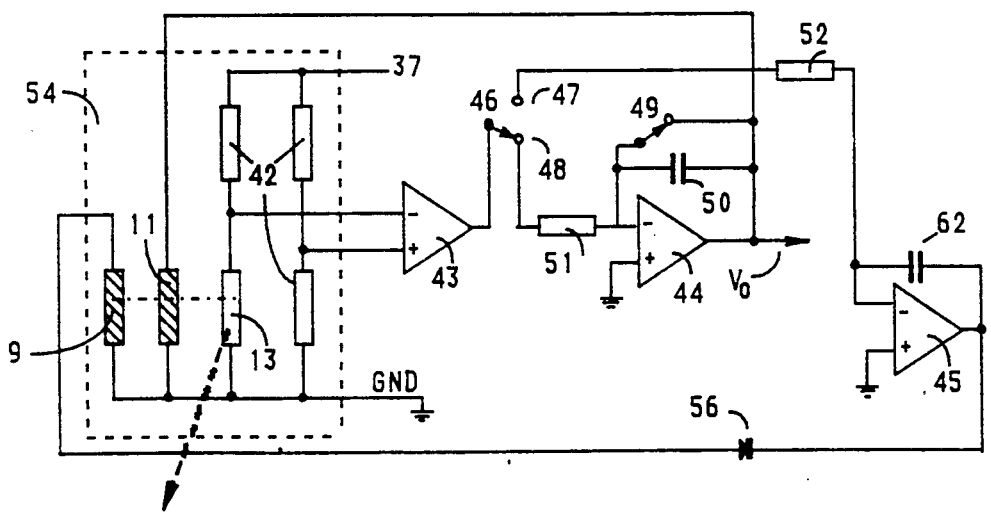
FIG. 9 is a schematic for interface with a multi-layer sensor

To interface with a more complex sensor, like that depicted in FIG. 3, the circuit illustrated in FIG. 9 can be used. It is comprised of three amplifiers 43, 44 and 45, a number of passive components and a supply voltage 37. The active sensor 54 contains a resistive bridge made with resistors 42 and a temperature sensitive layer 13 which in this case is a thermistor.

Two control loops are formed in the circuit. Both loops share the resistive bridge and the amplifier 43. The loops do not operate simultaneously. When cover 59 is closed, the wiper of switch 46 connects the output of amplifier 43 to contact 47 and switch 49 is closed, forcing output voltage $V_o$ to zero. The first control loop around the bridge is closed. The first loop includes integrating amplifier 45, resistor 52, capacitor 62, and first heating layer 9. Optional diode 56 protects the loop from an inverted polarity. The loop reaches a steady state when the output of amplifier 43 becomes equal to zero. This indicates that non-radiative loss in temperature sensitive layer 13 is fully compensated for by heat from layer 9.

Upon opening cover 59, switch 46 moves its wiper to contact 48 and switch 49 opens. The first loop is opened and capacitor 62 remembers the output voltage. That voltage continues to supply layer 9 with compensating energy. A second control loop includes an amplifier 44, resistors 51, capacitor 50 and second heating layer 11. Temperature of the sensitive layer 13 drops because of thermal radiation loss toward an object. This results in its increased resistance and causes the bridge to disbalance. This increases current through heating layer 11 subsequently causing the sensitive layer 13 to warm up, bringing the bridge back to balance. As a result, output voltage $V_o$ and the resistance of layer 11 can be used in equation (3) to calculate the object's temperature.

Figure 8:
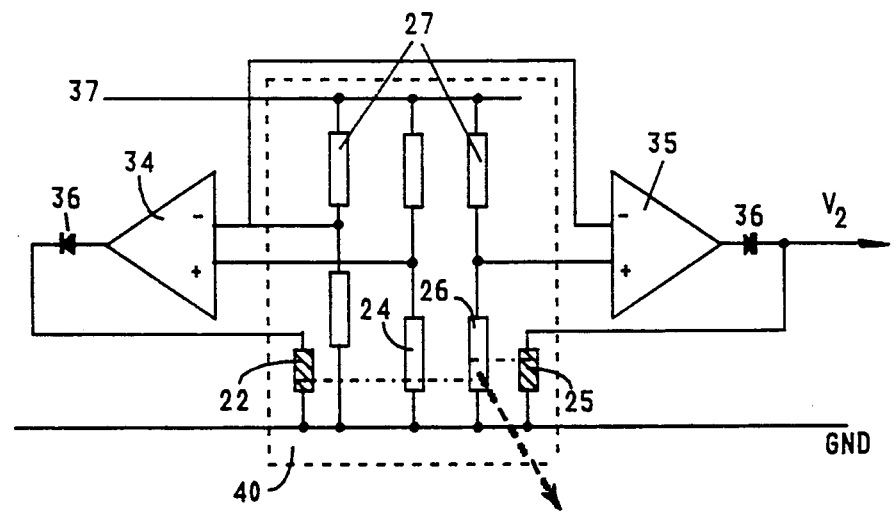
FIG. 8 is a schematic for a dual sensor control

A dual sensor, such as shown in FIG. 6, requires another interface circuit which is exemplified by FIG. 8. It contains two amplifiers 34 and 35, which interface with sensor 40. The left amplifier 34 is for loss compensation and is controlled by the shielded from radiation, temperature sensitive layer 24 while the right amplifier 35 is for thermal radiation measurement and its positive input is interfaced with emissive temperature sensitive layer 26. Constant resistors 27 complete a bridge circuit which is connected to the supply voltage 37. Optical diodes 36 protect the circuit against wrong polarities. Since heating layer 22 is in intimate thermal coupling with both temperature sensitive layers 24 and 26 (this is indicated by a dashed line), it provides the same amount of heat to both of them. When the bridge attached to the amplifier 34 is in balance, that level of heat is sufficient for the full loss compensation. A voltage $V_2$ across the second heating pad 25 can be used in equation (3) for the temperature calculation. For normal operation, a dual sensor doesn't necessary require a cover as non-symmetrical sensors do.

Figure 11:
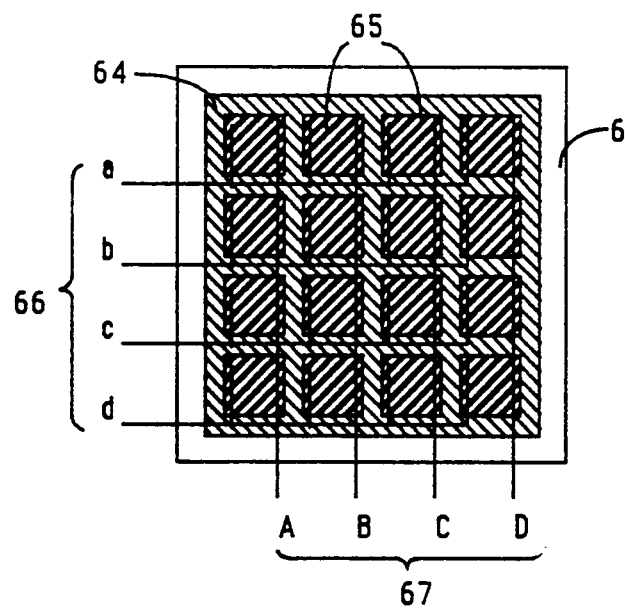
FIG. 11 is a schematic view of a thermal imaging sensor
Figure 12:
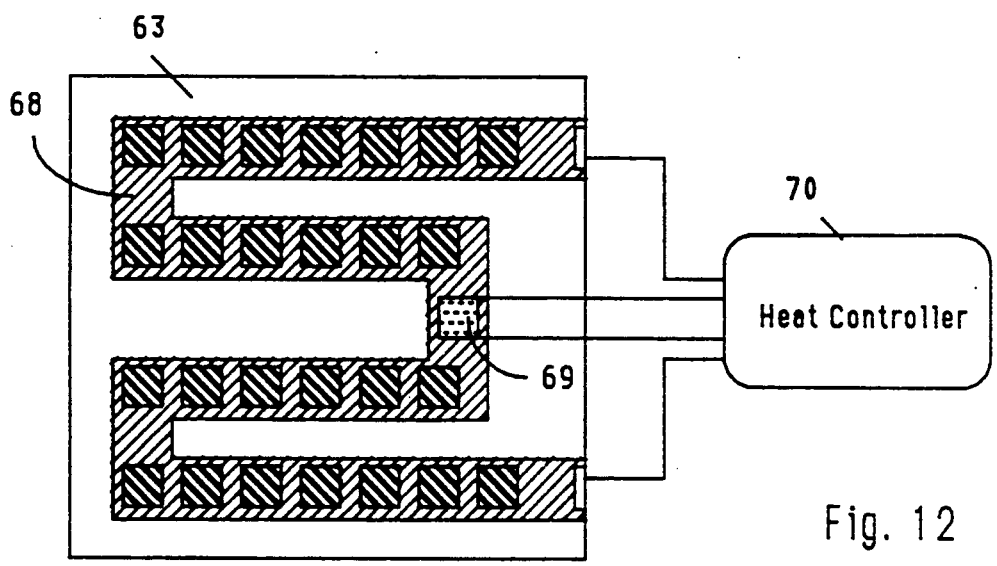
FIG. 12 is a schematic view of a thermal imaging sensor with a strip heater

Small temperature sensitive elements deposited on a common heating pad may form a multiple pixel imaging detector. Such a detector, when used in a combination with far infrared optics, can be used for the conversion of thermal images into visible pictures observable on CRT, LCD displays and other output devices. FIG. 11 illustrates one such sensor arrangement. It comprises a substrate 63, a heating pad 64, temperature sensitive elements or thermal cells 65, and two sets of selecting lines: rows 66, and columns 67. An overall design of the sensor may follow one of the methods illustrated in FIGS. 1-6. Each thermal cell may be used to measure a temperature at its location through the selecting lines, 66 and 67. An external circuit will multiplex the cells 65, and convert their resistances into electric signals. FIG. 12 shows a different embodiment of an imaging sensor, where all thermal cells are positioned on the serpentine-like heating strip 68, deposited on a thin substrate 63. At least one reference cell 69 can be connected to a heat controller 70 to control temperature of strip 68. The surface of the reference cell must be either given a low emissive coating, or the cell must be shielded from the object.

Figure 14:
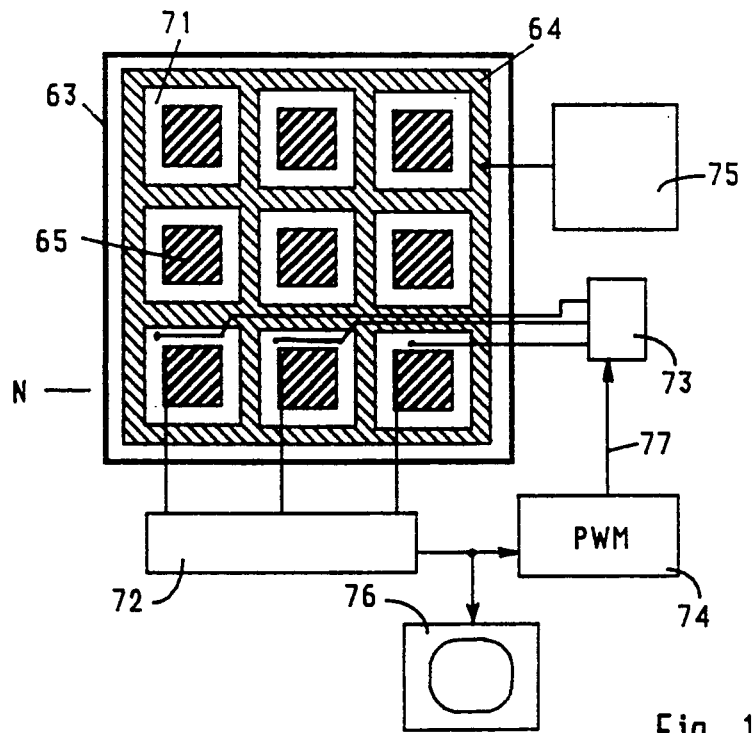
FIG. 14 is a schematic view of an imaging sensor with multiplexing heat control

A method to control temperature of an individual cell is illustrated in FIG. 14. Substrate 63 is given first heating layer 64 whose function is to provide a thermostatic (baseline) effect to reduce influence of the environment. Electric current through that layer is supplied by control circuit 75. Each cell (pixel) is comprised of temperature sensitive layer 65 and a heating pad 71. All temperature sensitive layers and all heating pads are respectively multiplexed. For the illustration purpose this is shown for the row N, which is connected to multiplexers 72 and 73. The multiplexed signals from temperature sensitive layers are fed into a modulator which in this illustration is pulse-width modulator (PWM) 74 whose output signal is distributed to the heating pads via multiplexer 73. An image monitor 76 is also connected to the multiplexer 72. Its function is to convert temperature related signals into a visible image.

Figure 15:
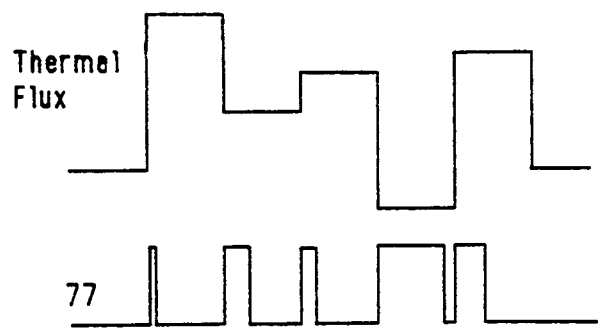
FIG. 15 is a timing diagram showing relationship between thermal flux and heat controlling pulses.

The sensor of FIG. 14 works as follows. Each cell radiates thermal energy through an optical system toward the object. The optical components are of a conventional design and not shown in FIG. 14. The radiated power depends on temperature of the object's corresponding area. A temperature sensitive layer 65 of a cell reacts to that energy transfer by changing its resistance. Through multiplexer 72, that resistance controls duration of electric pulse 77 generated by pulse-width modulator 74. FIG. 15 illustrates how variable thermal flux controls width of pulses 77. These pulses are fed to the corresponding heating pad 71 of the cell via multiplexer 73. The lower temperature of layer 65, the wider is the pulse, the higher is its duty cycle and the more energy is supplied to pad 71 thus maintaining the pad's temperature on the predetermined level. In other words, temperature sensitive layer 65 controls heating of its own underlaying pad 71, making each cell to act as a sensor identical to that shown in FIG. 3.

I claim

1. An apparatus for thermal sensing of an object by emitting thermal radiation toward said object, said apparatus comprising:
   an active thermal radiation sensor capable of emitting thermal radiation, said sensor including:
   a first temperature sensitive means,
   a first means for heating by receiving electrical energy, attached to said temperature sensitive means for heating said first temperature sensitive means, and
   means for providing a first signal indicative of electrical heating energy received by said means for heating, required to maintain said temperature sensitive means at a predetermined temperature upon radiation of thermal energy from said active radiation sensor toward said object.

2. An apparatus as described in claim 1, said apparatus further comprising:
   a second means for heating by receiving electrical energy, attached to said active thermal radiation sensor for providing a baseline temperature for said temperature sensitive means.

3. An apparatus as described in claim 1, further comprising:
   shutter means for interrupting thermal radiation, adapted for mounting adjacent to said thermal radiation sensor for interrupting radiation from said thermal radiation sensor toward said object.

4. An apparatus as described in claim 3, further comprising:
   said shutter means including a highly emissive surface for positioning adjacent to said active thermal radiation sensor, said apparatus further comprising:
   a second temperature sensitive means mounted in said apparatus for measuring the temperature of said shutter means for providing a second electrical signal indicative of ambient temperature.

5. An apparatus as described in claim 3, further comprising:
   said shutter means including a highly reflective surface for positioning adjacent to said active thermal radiation sensor.

6. An apparatus for thermal sensing of an object by emitting thermal radiation toward said object, said apparatus comprising:
   an active thermal radiation sensor capable of emitting thermal radiation, said sensor comprising:
   a first temperature sensitive means,
   a first means for heating by receiving electrical energy, attached to said temperature sensitive means for heating said first temperature sensitive means,
   said first temperature sensitive means being for producing a first electrical signal responsive to the temperature of said first temperature sensitive means,
   said apparatus further comprising:
   electrical circuit means responsive to said first electrical signal for controlling electrical heating energy received by said first means for heating, connected to said first temperature sensitive means for sensing said first signal and connected to said first means for heating for controlling said energy received by said first means for heating for maintaining said first temperature sensitive means at a predetermined temperature,
   said electrical circuit means further comprising means for providing a second signal indicative of electrical energy required to maintain said first temperature sensitive means at the predetermined temperature, upon radiation of thermal energy from said active thermal radiation sensor toward said object.

7. An apparatus as described in claim 6, said apparatus further comprising:

a second means for heating, attached to said active thermal radiation sensor for providing a baseline temperature for said temperature sensitive means.

8. An apparatus as described in claim 6, further comprising:
   a second temperature sensitive means attached to said active thermal radiation sensor, and
   means for preventing thermal energy from being radiated toward said object from said second temperature sensitive means,
   a second means for heating by receiving electrical energy, attached to said active thermal radiation sensor for equally heating said first and second temperature sensitive means.

9. An apparatus as described in claim 8, further comprising:
   said second temperature sensitive means further being for producing a third electrical signal responsive to the temperature of said second temperature sensitive means,
   said apparatus further comprising: a second electrical circuit means responsive to said third electrical signal for controlling electrical energy received by said second heating means, connected to said second temperature sensitive means for sensing said third signal and connected to said second heating means for controlling said energy received by said second heating means for maintaining said second temperature sensitive means at a predetermined temperature.

* * * * *

UNITED STATES PATENT AND TRADEMARK OFFICE
CERTIFICATE OF CORRECTION

PATENT NO. : 5,054,936
DATED : Oct. 8, 1991
INVENTOR(S) : Jacob Fraden

It is certified that error appears in the above-identified patent and that said Letters Patent is hereby corrected as shown below:

Column 8, line 57, change "Optical" to --Optional--.

Signed and Sealed this

Ninth Day of February, 1993

Attest:

STEPHEN G. KUNIN

*Attesting Officer*  *Acting Commissioner of Patents and Trademarks*